Nov. 4, 1969 D. M. BELL ET AL 3,476,982

CIRCUIT BOARD RECEIVER AND RETAINER

Filed Dec. 11, 1967 3 Sheets-Sheet 1

INVENTORS
DAVID M. BELL
FLOYD W. BELL

BY-MAHONEY, MILLER & RAMBO
BY Wm. V. Miller
ATTORNEYS

INVENTORS
DAVID M. BELL
FLOYD W. BELL
BY-MAHONEY, MILLER & RAMBO
BY Wm. V. Miller
ATTORNEYS

CIRCUIT BOARD RECEIVER AND RETAINER

INVENTORS
DAVID M. BELL
FLOYD W. BELL

BY-MAHONEY, MILLER & RAMBO
BY Wm. V. Miller
ATTORNEYS

United States Patent Office 3,476,982

Patented Nov. 4, 1969

3,476,982

CIRCUIT BOARD RECEIVER AND RETAINER

David M. Bell and Floyd W. Bell, Columbus, Ohio, assignors to The Buckeye Stamping Company, Columbus, Ohio, a corporation of Ohio Filed Dec. 11, 1967, Ser. No. 689,401

Int. Cl. H02b *1/04, 9/00;* H05k *1/00*

U.S. Cl. 317—101 8 Claims

ABSTRACT OF THE DISCLOSURE

A circuit board receiver and retainer arrangement for receiving and retaining in a preselected pattern one or more circuit boards or cards, such as printed circuit boards, in associtaion with electrical connectors, the arrangement being such that it properly receives standard boards and associated standard connectors. It is made up of at least one pair of opposed sections which provide a pair of guide channels or sockets for receiving the opposite edges of a circuit board and means for mounting the usual electrical connector in alignment with the pair of opposed guide channels for receiving the lower edge of the circuit board. The arrangement is such that greater flexibility and easier packaging of printed circuit boards or cards results as compared to prior art arrangements.

In the accompanying drawings, there is illustrated a preferred embodiment of this invention and in these drawings:

FIGURE 1 is a perspective view of a complete multi-channel guide section or module provided in accordance with this invention.

FIGURE 1*a* is a view similar to FIGURE 1 but showing a guide section with a single guide channel.

FIGURE 2 is a view similar to FIGURE 1 but showing the mounting shelf removed therefrom ready to mount the connectors thereon.

FIGURE 2*a* is a view similar to FIGURE 1*a* but showing the mounting clip or shelf removed.

Figures 1, 2:
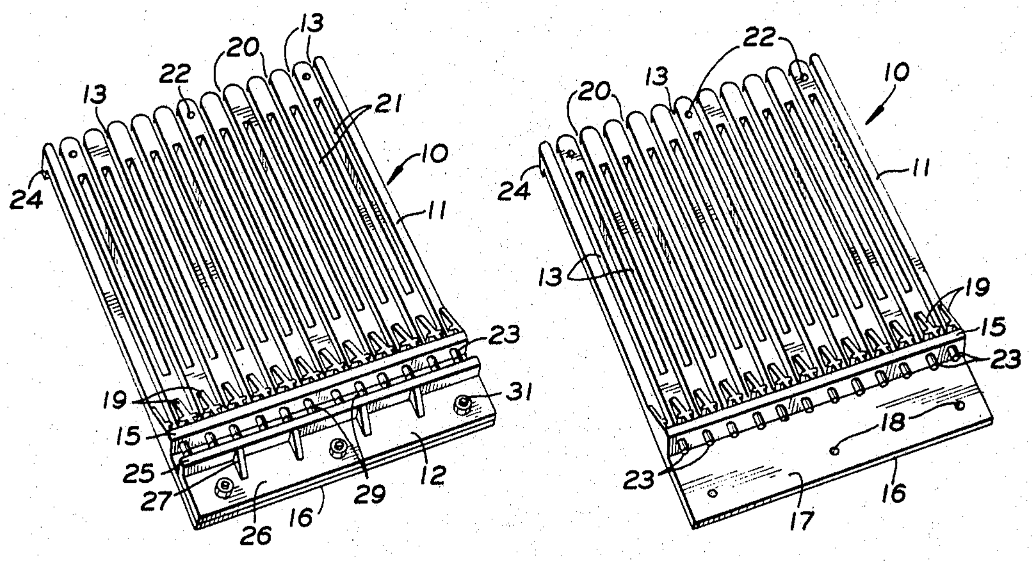

With reference to the drawings, there is illustrated a preferred form of guide section which can be used in a circuit board receiver and retainer assembly in accordance with this invention. This particular section is of the multi-channel type for use in opposed pairs to receive a predetermined number of circuit boards and associated circuit connectors. The section is indicated generally by the numeral 10 but consists of the two separable parts, namely, the body 11 and the mounting shelf 12, both parts preferably being molded separately of a suitable plastic, electrically insulating material. The body 11 is substantially flat but has a plurality of side-by-side, upwardly-opening board-receiving guide channels 13 formed in its one face which will be its inner face as positioned in a rack or other similar assembly. All the channels are disposed in spaced parallel relationship across the inner face of the body and have their lower closed ends terminating at 14 just slightly above a projecting ledge 15 which projects from the face of the body at a level spaced substantially above its lower edge 16. Between the ledge 15 and the lower edge 16 there is a plane surface 17 against which the separate mounting shelf 12 is adapted to be clamped and a series of clamping bolt openings 18 extend through the body 11 at this surface. Fillets 19 are provided at the corner between the ledge 15 and the vertical part of the body 11 for strength but it will be noted that the lower portions of the upright guide channels 13 are located at one side of the respective fillets. As described, the upper ends of the guide channels are open and as indicated at 20 in the drawings, these ends are flared outwardly so as to receive and direct the lower edges of the circuit boards into these channels. Between the channels 13, the body is provided with vertically extending, ventilating slots 21, which are parallel with the channels. Above these slots the body is provided with a plurality of bolt-receiving openings 22 spaced across the body and extending therethrough. In vertical alignment with each of the channels 13 and projecting downwardly from the ledge 15 is an integral connector locating pin or dowel 23. The body 11 has a rearwardly projecting mounting lip 24 extending across its upper end above the openings 22.

Figures 3, 4, 8:
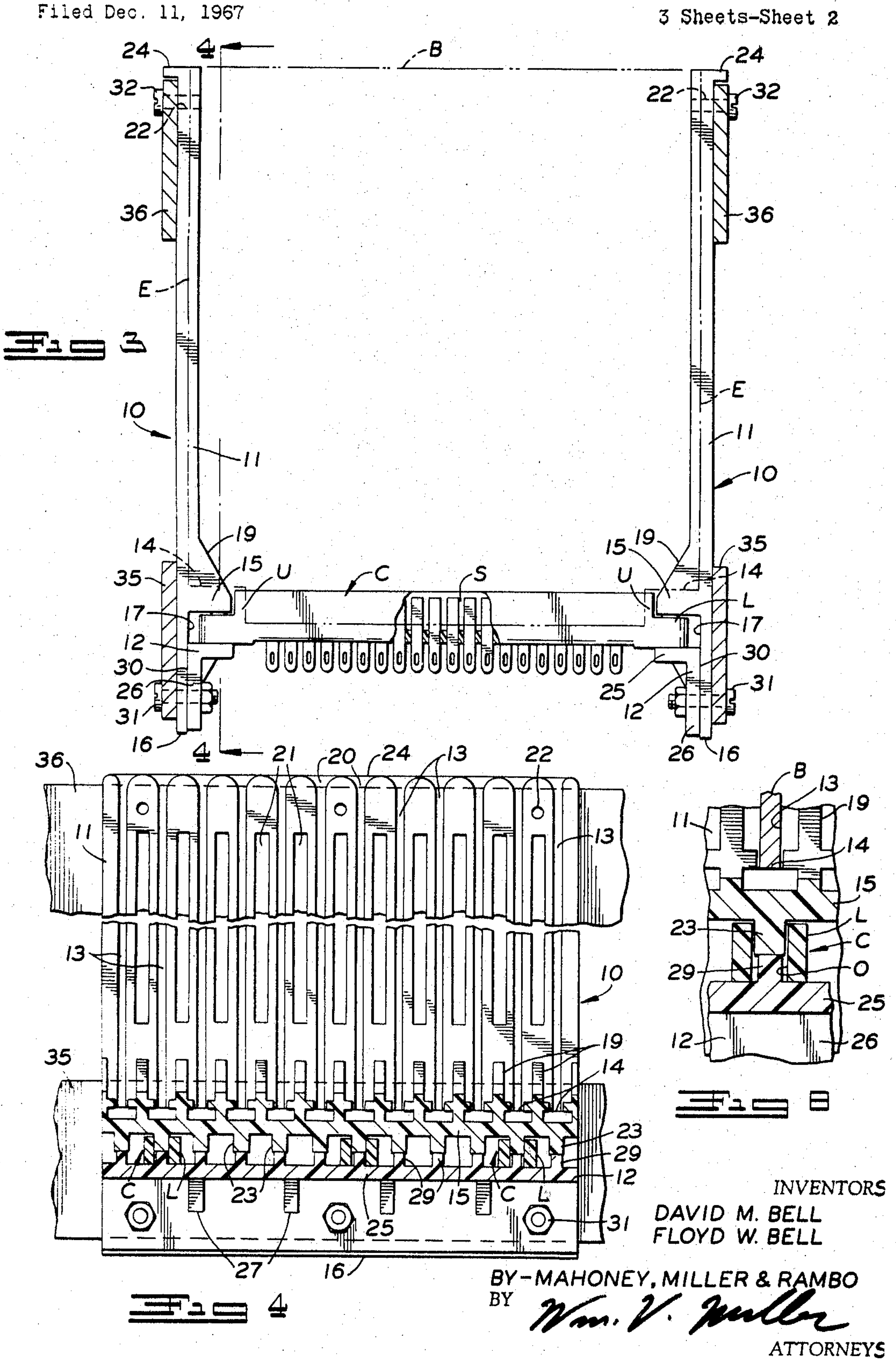
FIGURE 3 is an end elevational view of a rack embodying a plurality of the multi-channel guide sections.
FIGURE 4 is a vertical sectional view taken along line 4—4 of FIGURE 3.
FIGURE 8 is an enlarged sectional view taken along line 8—8 of FIGURE 6.

The mounting shelf 12 is of inverted L-shaped cross section in vertical transverse section and comprises a projecting connector supporting horizontal ledge 25 and a vertically disposed mounting flange 26 extending downwardly at a right angle thereto and having reinforcing fillets 27 therebetween. The flange 26 is provided with a plurality of openings 28 which can be aligned with the openings 18 on the body 11. The shelf ledge 25 is provided with a series of integral upstanding connector-locating pins or dowels 29 which are in the same number as the pins 23 and are similarly spaced so that they can be aligned therewith when the shelf 12 is clamped to the body 11. The shelf is so clamped in position by placing the flat surface 30 of its flange 26, the surface opposite the one bearing the ledge 25, against the flat mounting surface 17, aligning the openings 28 and 18, and then passing the clamping bolts 31 therethrough. This will position the pins 23 and 29 in opposed vertical axial alignment with their adjacent ends in contact, as shown in FIGURE 8. Preferably the lower pins 29 are of lesser diameter than the upper pins 23.

Figure 1A:
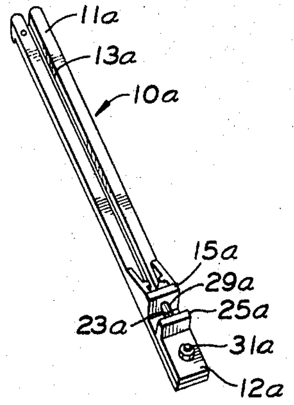
Figure 2A:
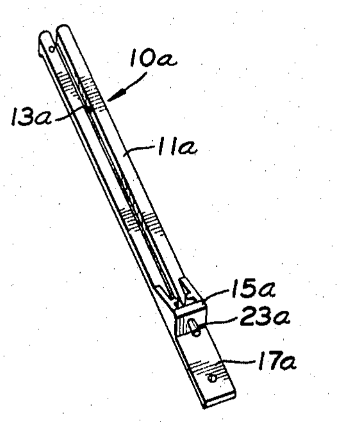

The guide section 10*a* shown in FIGURES 1*a* and 2*a* is like that shown in FIGURES 1 and 2 except that it has a single guide channel 13*a* rather than a plurality of side-by-side guide channels, formed in its body 11*a*. At the lower end of the guide channel 13*a* it has a projecting ledge 15*a* with a depending stud or pin 23*a*. The mounting clip or shelf 12*a* is secured to the flat mounting surface 17*a* below the ledge 15*a* by means of a clamping bolt 31*a*. The shelf has a supporting ledge 25*a* which is provided with the upstanding pin 29*a*. This guide section will function exactly as before except that it will receive the edge of one circuit board only.

As indicated, the guide sections described are adapted to be assembled in opposed pairs to receive and position in a pre-determined arrangement or pattern, circuit boards indicated at B in FIGURES 3, 5, 6, and 8, and associated circuit board electrical connectors C. The boards and connectors can be of the standard type and are so illustrated. In FIGURES 3 to 8, the guide sections are shown as multi-sections 10 but it will be readily understood that the single sections 10*a* can be mounted and used in a similar manner.

The boards B need not be described except to indicate that they are flat and have opposed plane side edges E which are adapted to be slipped downwardly into opposed channels 13, the flared upper ends 20 of the channels facilitating this insertion. The connectors are standard but it should be indicated that when positioned in the assembly they have upwardly opening sockets S for receiving the lower edges of the board B which are positioned in the associated guide channels 13. At each end of the connector is a mounting lug L projecting outwardly therefrom providing an associated upstanding shoulder U, the lug having an opening O extending vertically therethrough.

Figure 5:
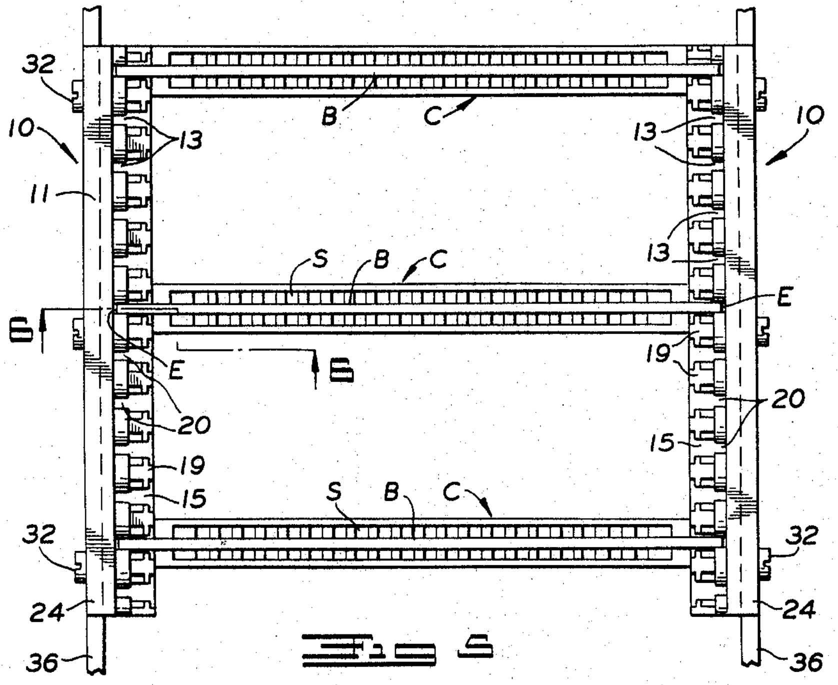
FIGURE 5 is a fragmentary plan view of the rack.
Figure 6:
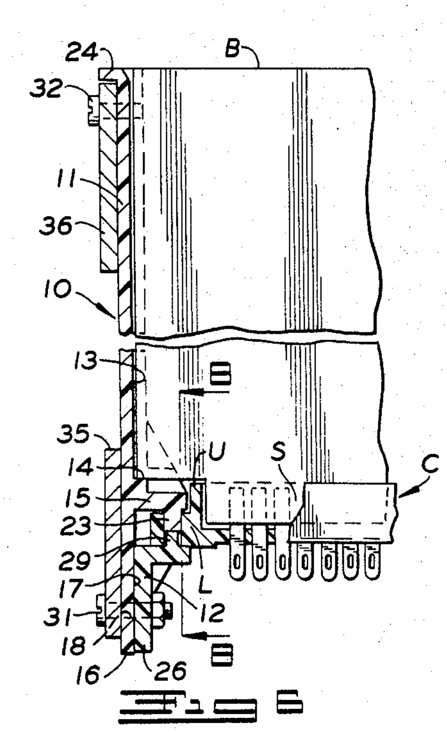
FIGURE 6 is a vertical sectional view taken along line 6—6 of FIGURE 5.
Figure 7:
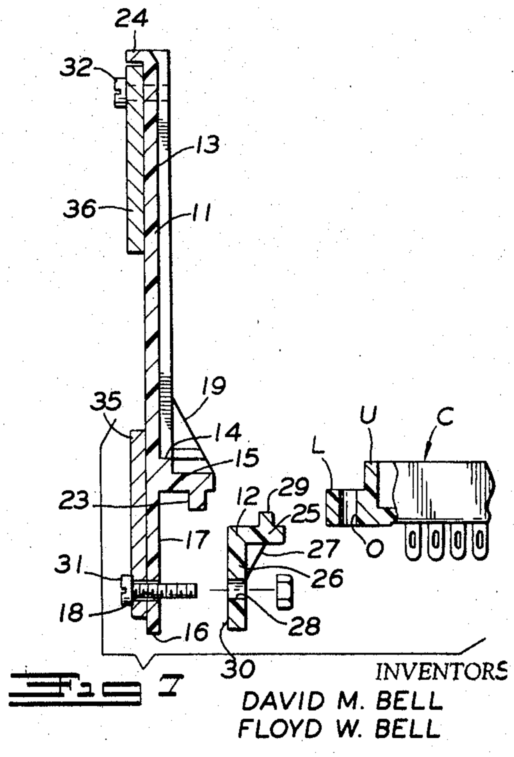
FIGURE 7 is a view similar to FIGURE 6 but showing parts disassembled.

In making a rack or assembly for receiving the circuit boards B, as indicated in FIGURES 3 to 5, one or more pairs of the sections 10 may be supported oppositely, with their channels 13 facing inwardly and in longitudinal alignment by means of longitudinally extending, laterally spaced, parallel lower bars 35 and similar upper bars 36. The ledges 24 of the sections 10 will rest on the upper edges of the bars 36 to accurately locate them vertically and the sections will be secured to these bars by the clamping bolts 32 which will pass through openings in the bars that align with the threaded openings 22 in the upper portions of the sections 10. Th sections may be fastened to the lower bars 35 by the bolts 31 which also clamp the shelf members 12 in place. The connectors C will serve to space the opposed sections 10 laterally and the lugs L thereof will be positioned between the ledges 15 and 25 of the respective members 11 and 12, the shoulders U almost engaging the inner edge of the ledges 15. At the time the connector lugs L are being connected to the opposed guide sections 10, the shelf members 12 will be removed, so that the lugs may be slipped over the studs or pins 23. Thereafter, the shelf members 12 are mounted in position on the members 11 with their studs or pins 29 extending into the openings O toward the axially aligned pins 23, and with their respective inner ends in actual contact. The opposed pins 23–29 are of an axial extent greater than the thickness of the connector lugs L. The openings O are of slightly greater diameter (FIGURE 8) than the diameter of the larger pins 23 so that, during insertion of the boards B into the opposed guide channels 13, limited relative movement between the ends of the connector C and the cooperating guide sections 10 will be permitted, if necessary. This relative movement will be permitted because of the slight spacing of associated parts at the shoulder U and the fact that the lugs L will not be clamped between the ledges 15 and 25 due to the lengths of the sets of combined pins 23 and 29. Pivoting or relative movement between the connector lugs L and associated parts of the sections 10 will be limited by the shoulders U contacting the ledges 15.

Thus, this guide section construction and arrangement provides a simple effective assembly for receiving and retaining circuit boards and connectors in cooperation therewith. Slight warping of the boards will be compensated for by permitting the connector lugs to pivot and otherwise shift about the cooperating studs or pins 23–29. The two pins are larger than the thickness of the connector lugs to prevent actual clamping of the lugs so as to permit any necessary adjustment about the pins. No other mounting hardware is needed since because of the pin arrangement, the axes of which are aligned with the board-receiving guide channels, the board will be properly aligned with its associated connector. The assembly of the connectors and the associated guide sections is greatly simplified by this arrangement so that greater flexibility and easier packaging of the circuit boards result.

Having thus described this invention, what is claimed is:

1. A circuit board guide section for use in opposed pairs in positioning circuit boards and cooperating connectors, the boards having side edges and a lower edge and the respective connectors having ends provided with mounting openings and upwardly opening sockets for receiving the lower edges of the respective circuit boards; each of the guide sections comprising a body having a guide channel formed in the inner surface thereof which opens at its upper end and has a lower end, an inwardly projecting ledge on said body adjacent the lower end of the guide channel, said ledge having a depending stud vertically aligning with said channel, a connector-mounting shelf positioned on said body below said ledge and having an inwardly projecting ledge, said ledge having an upwardly projecting stud, and means for attaching said shelf to said body with its ledge below the ledge of the body and with its stud extending upwardly in alignment with the associated depending stud on said ledge.

2. A circuit board guide section according to claim 1 in which the body has a surface below said ledge thereon against which the shelf member is clamped, said attaching means including clamping and locating members which clamp the shelf on said surface to align the opposed studs with their adjacent ends almost in contact.

3. A circuit board guide section according to claim 2 in which said body has an outwardly projecting locating lip on its upper edge and associated mounting openings.

4. A circuit board guide section according to claim 2 in which said body has a plurality of guide channels therein disposed side-by-side.

5. A circuit board guide section according to claim 1 in which the upper end of the guide channel is flared to facilitate insertion of the board therein.

6. A pair of circuit board guide section as set forth in claim 1 assembled with their inner surfaces facing each other and their channels in opposed alignment for receiving the opposite side edges of the board, a connector supported therebetween with ends resting on the shelf members of the respective opposed guide sections, said connector having openings in its ends which receive the opposed pairs of axially aligned studs on the body and shelf members of said respective guide sections.

7. The structure of claim 6 in which said opposed pairs of studs are of sufficient length that when their adjacent ends contact, the said ledges of the shelf members and body are spaced apart a distance greater than the thickness of the cooperating end of said connector located therebetween.

8. The structure of claim 7 in which the connector has a stop shoulder associated with one of said ledges and normally spaced therefrom.

References Cited

UNITED STATES PATENTS

| | | | |
|---|---|---|---|
| 3,017,232 | 1/1962 | Schwab et al. | 339—176 |
| 3,197,483 | 5/1967 | Beale et al. | 339—176 |
| 3,320,483 | 5/1967 | Pohl. | |

ROBERT K. SCHAEFER, Primary Examiner

J. R. SCOTT, Assistant Examiner

U.S. Cl. X.R.

339—17